(12) United States Patent
Youn

(10) Patent No.: US 9,810,719 B2
(45) Date of Patent: Nov. 7, 2017

(54) NEUTRAL POLE CURRENT TRANSFORMER MODULE FOR CIRCUIT BREAKER AND NEUTRAL POLE CURRENT DETECTING APPARATUS FOR CIRCUIT BREAKER

(71) Applicant: LSIS CO., LTD., Anyang-si, Gyeonggi-do (KR)

(72) Inventor: Jin Seok Youn, Cheongju-si (KR)

(73) Assignee: LSIS CO., LTD., Anyang-si (KR)

( * ) Notice: Subject to any disclaimer, the term of this patent is extended or adjusted under 35 U.S.C. 154(b) by 155 days.

(21) Appl. No.: 14/737,374

(22) Filed: Jun. 11, 2015

(65) Prior Publication Data

US 2015/0377930 A1 Dec. 31, 2015

(30) Foreign Application Priority Data

Jun. 30, 2014 (KR) .................. 10-2014-0081174

(51) Int. Cl.
| | |
|---|---|
| *G01R 15/18* | (2006.01) |
| *H02H 3/08* | (2006.01) |
| *H01F 38/30* | (2006.01) |
| *H01H 71/12* | (2006.01) |
| *H01H 83/02* | (2006.01) |
| *H01H 50/02* | (2006.01) |

(52) U.S. Cl.
CPC ........... *G01R 15/181* (2013.01); *H01F 38/30* (2013.01); *H01H 50/021* (2013.01);
(Continued)

(58) Field of Classification Search
CPC ............ H02H 3/165; H02H 3/34; H02H 3/08; H02H 3/083; H01H 9/02; G01R 15/181; G01R 15/183
See application file for complete search history.

(56) References Cited

U.S. PATENT DOCUMENTS 4,589,052 A 5/1986 Dougherty
4,702,002 A * 10/1987 Morris ................ H01H 83/144
29/525
(Continued)

FOREIGN PATENT DOCUMENTS

CN 101211725 7/2008
DE 10004833 8/2001
(Continued)

OTHER PUBLICATIONS

European Patent Office Application Serial No. 151711405, Search Report dated Dec. 7, 2015, 7 pages.
(Continued)

*Primary Examiner* — Stephen W Jackson
*Assistant Examiner* — Christopher Clark
(74) *Attorney, Agent, or Firm* — Lee, Hong, Degerman, Kang & Waimey

(57) ABSTRACT

There is provided a neutral pole transformer module for a circuit breaker capable of minimizing an influence of external noise, detecting a neutral pole current at low manufacturing cost, and detecting a neutral pole current without modifying a configuration of an existing overcurrent relay or without installing an additional component in the existing overcurrent relay. The neutral pole transformer module for a circuit breaker comprises a ZCT configured to allow a transmission line of a neutral pole detection current output from the current transformer to pass therethrough and to provide a secondary output current signal obtained by reducing the neutral pole detection current in a predetermined ratio; a printed circuit board configured to convert the secondary output current signal into a voltage signal, and to differentiate the converted voltage signal and output the same; and an enclosure formed of an electrical insulator and enclosing the ZCT and the PCB.

8 Claims, 6 Drawing Sheets

(52) U.S. Cl.
CPC .......... *H01H 71/125* (2013.01); *H01H 83/02* (2013.01); *H02H 3/083* (2013.01); *G01R 15/18* (2013.01)

(56) References Cited

U.S. PATENT DOCUMENTS

| | | | |
|---|---|---|---|
| 8,251,253 B1* | 8/2012 | Cleghorn | H01H 9/02 |
| | | | 174/50 |
| 2008/0158762 A1* | 7/2008 | Lenhart | H01H 71/7409 |
| | | | 361/93.2 |
| 2009/0257163 A1* | 10/2009 | Vicente | H02H 3/006 |
| | | | 361/91.1 |
| 2013/0027162 A1* | 1/2013 | Carlino | H01F 38/30 |
| | | | 336/90 |

FOREIGN PATENT DOCUMENTS

| | | |
|---|---|---|
| JP | 2008-277164 | 11/2008 |
| JP | 2008-277227 | 11/2008 |
| JP | 2008-305595 | 12/2008 |
| JP | 2013-062955 | 4/2013 |
| WO | 2010/005987 | 1/2010 |

OTHER PUBLICATIONS

State Intellectual Property Office of the People's Republic of China Application Serial No. 201510374316.1, Office Action dated Jan. 25, 2017, 6 pages.
Korean Intellectual Property Office Application Serial No. 10-2014-0081174, Notice of Allowance dated May 8, 2015, 2 pages.

* cited by examiner

NEUTRAL POLE CURRENT TRANSFORMER MODULE FOR CIRCUIT BREAKER AND NEUTRAL POLE CURRENT DETECTING APPARATUS FOR CIRCUIT BREAKER

CROSS-REFERENCE TO RELATED APPLICATION

Pursuant to 35 U.S.C. §119(a), this application claims the benefit of earlier filing date and right of priority to Korean Application No. 10-2014-0081174, filed on Jun. 30, 2014, the contents of which is incorporated by reference herein in its entirety.

BACKGROUND OF THE INVENTION

1. Field of the Invention

The present disclosure relates to a circuit breaker, and more particularly, to a neutral pole current transformer module for detecting a neutral pole (also called a neutral phase, N phase, or N pole) current in a three-phase four-wire type or a so-called 4-pole circuit breaker having an overcurrent relay (can be abbreviated as OCR) as a control unit, and a neutral pole current detecting apparatus having such a neutral pole transformer module.

2. Background of the Invention

A neutral pole (in other words "N phase") refers to a pole (that is "phase") of an electric line connected to a neutral point when a transformer is Y-connected in a single phase three-wire alternating current or three-phase alternating current grid. Distinguished from a ground line, a neutral pole line (hereinafter, referred to as a "neutral line") is classified as a voltage line.

In an electric power distribution grid, in addition to line voltages of 3 phases such as R phase, S phase, and T phase, a voltage between the three-phase lines and a neutral line, namely, a phase voltage may be used, and here, the line voltages are mainly used as an electric power to drive an electric motor, while the phase voltage is commonly used to turn on an electric light.

A current flowing in a neutral line is not greater than 20% of a phase current such as an R-phase current, an S-phase current, and a T-phase current, but this considers only an unbalance current. When a nonlinear load (e.g., a rectifier, an inverter, an uninterruptible power supply, a computer, a monitor, a copy machine, etc.) or a load generating harmonics, such as an electric furnace or an electric welder exists, a current flowing in the neutral line is greater than a phase current in many cases. Thus, protection for a neutral pole circuit, namely, a neutral line, is required.

FIG. 1 is a view illustrating a configuration of a protecting device of a neutral pole circuit according to an example of a related art.

In FIG. 1, the protecting device of a neutral pole circuit according to an example of the related art may comprise a Rogowski coil 1a for detecting a neutral pole current and providing the same and a circuit breaker 100.

The circuit breaker 100 comprises three switching contacts 50 for three phases, an overcurrent relay 40, and three phase current detectors 60.

The three switching contacts 50 each comprise a fixed contact and a movable contact having a circuit closing position in which each switching contact is brought into contact with a corresponding fixed contact to close an electric power circuit 2 of each phase (here, an R-phase electric power circuit is designated by reference numeral 2a, an S-phase electric power circuit is designated by reference numeral 2b, and an T-phase electric power circuit is designated by reference numeral 2c) and a circuit opening position in which each switching contact is separated from a corresponding fixed contact to open the electric power circuit 2 of each phase.

The circuit breaker 100 may comprise a switching mechanism (please refer to 50a of FIG. 4) providing mechanical driving power for switching the movable contact to the circuit closing position or the circuit opening position, and a configuration of the switching mechanism may be referred to Korean Patent document KR10-0771918 B1 registered by an applicant of the present invention.

The overcurrent relay 40 is a control unit for controlling a switching operation of the circuit breaker 100. The overcurrent relay 40 is connected to the Rogowski coil 1a and the current detector 60 and receives a neutral pole current and detection signals of the three-phase currents respectively from the Rogowski coil 1a and the phase current detector 60. Also, the overcurrent relay 40 compares values according to the received current detection signals with preset reference values, and when any one of the values according to the received current detection signals is equal to or greater than a corresponding reference value, the overcurrent relay 40 outputs a trip control signal. The trip control signal serves to trigger the switching mechanism to operate to the opening position through a trip actuator (not shown). Then, the movable contact is separated from a corresponding fixed contact by driving force provided from the switching mechanism, thus protecting the neutral pole circuit or the general three-phase circuits and electric load devices connected thereto from a fault current.

The three phase current detectors 60 are configured by Rogowski coils in a low-voltage circuit breaker such as an air circuit breaker.

The Rogowski coil, a device for basically measuring a current by using a change in magnetic flux caused as a current is changed, comprises a core having an annular shape allowing an electric line as a current amount measurement target to pass therethrough and a coil wound around the corresponding core. The Rogowski coil having differential characteristics, provides a 90-degree phase-shifted detection signal, compared with an actual current, as a voltage signal generally in units of millivolt (mV).

Since the Rogowski coil 1a for detecting a neutral pole current is a Rogowski coil, the Rogowski coil 1a has differential characteristics like the phase current detector 60, so it may provide a neutral pole current detection signal 90-degree phase-shifted than an actual current as a voltage signal.

However, a low voltage circuit breaker such as an air circuit breaker has a frame (i.e., a rear enclosure unit formed of an insulating partition of each phase) whose length is different according to magnitudes of a rated voltage (rated current). Thus, a size (width or diameter) of a bus bar corresponding to an electrical conductive terminal unit installed on a rear surface of the frame connected to an electric power source side electric line and a load side electric line is varied. Since the Rogowski coil 1a for detecting a neutral pole current or the phase current detector 60 are installed in the bus bar, the Rogowski coils 1a and the phase current detectors 60 in various sizes should be prepared according to sizes (widths or diameters) of the bus bar. Also, in order to manufacture the Rogowski coils 1a for detecting a neutral pole current, a plurality of metal molds for manufacturing a core and a plurality of insulator molds are required. Thus, the preparation of all the Rogowski coils 1a for detecting a neutral pole current according to the ratings incurs high manufacturing cost, and causes a manufacturing cost of the overall circuit breaker to increase for the manufacturer of the circuit breaker.

Also, while a voltage signal in units of millivolt is being transmitted from the Rogowski coil 1a for detecting a neutral pole current installed to be adjacent to the bus bar, an outer side of the circuit breaker, to the overcurrent relay 40 installed within the circuit breaker, a neutral pole current detect signal may be distorted or mixed due to an influence of external noise, causing the overcurrent relay 40 to malfunction to erroneously break the circuit.

Also, in order to prevent this problem, shielding noise from the Rogowski coil 1a for detecting a neutral pole current to the overcurrent relay 40 installed within the circuit breaker requires a shielding structure employing a high level of shielding technique, increasing cost of the circuit breaker.

Hereinafter, a configuration of a protecting device of a neutral pole circuit according to another example of the related art will be described.

Another example of the related art illustrated in FIG. 2 is different from one example of the related art illustrated in FIG. 1, in that a manufacturer of a circuit breaker without a Rogowski coil as a detection unit for detecting a neutral pole current sells the circuit breaker in which the detection unit for detecting a neutral pole current is not installed and a user self-installs a current transformer and that a differential circuit section 40a is installed in addition to an integration circuit basically installed within the overcurrent relay 40.

Here, the reason why the manufacturer sells the circuit breaker without the detection unit for detecting a neutral pole current is because, if the manufacturer directly manufactures or purchases and installs the detection unit for detecting a neutral pole current to sell the circuit breaker, cost of the detection unit for detecting a neutral pole current increases due to cost for investment and maintenance of basic manufacturing facilities, resulting in an increase in overall cost of the circuit breaker. Meanwhile, a customer (who purchases the detection unit for detecting a neutral pole current as a user) may easily purchase the current transformer 1 at low cost on the market, reducing the cost of the overall circuit breaker 100, and thus, benefiting both the purchaser and user and the circuit breaker manufacturer.

The phase current detector 60 is still configured as a Rogowski coil, and thus, an integration circuit section for restoring (compensating for) a 90-degree phase delay of the Rogowski coil is essential within the overcurrent relay 40.

In particular, when an overcurrent or a ground fault current is relayed (detected and a circuit is broken), a phase should be essentially restored (or compensated), the integration circuit section is provided within the overcurrent relay 40.

In a case where the current transformer 1, rather than the Rogowski coil, is installed as a detection unit for detecting a neutral pole current, since the current transformer 1 does not have differential characteristics, namely, the characteristics of delaying a phase by 90 degrees, the integration circuit section within the overcurrent relay 40 rather acts to lead the phase of the neutral pole detection current by 90 degrees, which may cause the overcurrent relay 40 to malfunction in detecting an overcurrent or ground fault current and breaking the circuit.

Thus, in order to prevent his, in the related art illustrated in FIG. 2 comprises the differential circuit section 40a for delaying a phase of the neutral pole detection current by 90 degrees, in front of the integration circuit section within the overcurrent relay 40.

However, for the manufacturers of hundreds types of circuit breakers based on rated capacity and functions, developing and manufacturing hundreds types of new overcurrent relays due to the installation of the differential circuit section for preventing malfunction in a neutral pole current detection that may not be used according to circuit breakers may be a significant waste in cost.

Also, in a case where transformers 1 having various capacities according to various rated currents are installed, rating plugs having various internal voltage dividing resistance capacities may be additionally used to make a detection current output signal have capacity of a degree of millivolt (not shown), but even in this case, hundreds types of rating plugs should be prepared.

SUMMARY OF THE INVENTION

Therefore, an object of the present invention is to provide a neutral pole transformer module for a circuit breaker capable of minimizing an influence of external noise generated when a current detection signal is transferred from a current detecting unit installed to be adjacent to a bus bar of a circuit breaker to the interior of the circuit breaker, detecting a neutral pole current at low manufacturing cost, and detecting a neutral pole current without modifying a configuration of an existing overcurrent relay or without installing an additional component in the existing overcurrent relay.

Another object of the present invention is to provide a neutral pole current detecting apparatus for a circuit breaker capable of minimizing an influence of external noise generated when a current detection signal is transferred to the interior of the circuit breaker, detecting a neutral pole current at low manufacturing cost, and detecting a neutral pole current without modifying a configuration of an existing overcurrent relay or without installing an additional component in the existing overcurrent relay.

Said an object of the present invention can be achieved by providing a neutral pole transformer module for a circuit breaker according to the present invention to which a current transformer for detecting a neutral pole current is connected, the neutral pole transformer module comprising:

a zero-phase current transformer configured to allow a transmission line of a neutral pole detection current output from the current transformer to pass therethrough and to provide a secondary output current signal obtained by reducing the neutral pole detection current in a predetermined ratio;

a printed circuit board connected to an output terminal of the zero-phase current transformer, configured to convert the secondary output current signal into a voltage signal, and to differentiate and output the converted voltage signal; and an enclosure formed of an electrical insulator and enclosing the zero-phase current transformer and the printed circuit board.

And said another object of the present invention can be achieved by providing a neutral pole current detecting apparatus for a circuit breaker, the neutral pole current detecting apparatus comprising:

a current transformer configured to detect a current of a neutral pole circuit among circuits and provide a current detection signal as a current signal;

a neutral pole transformer module configured to comprise a zero-phase current transformer configured to receive the current detection signal of the neutral pole circuit detected by the current transformer and reduce the current detection signal from the current transformer in a predetermined ratio and output the reduced current detection signal, a burden resistor configured to convert the reduced current detection signal output from the zero-phase current transformer into a voltage signal and provide the converted voltage signal, and a differential circuit section configured to differentiate the voltage signal provided from the burden resistor and output the differentiated voltage signal; and an overcurrent relay configured to comprise an integration circuit section configured to be electrically connected to an output terminal of the neutral pole transformer module and to integrate an output signal output from the neutral pole transformer module to restore a phase delayed by the differential circuit section, and a control unit configured to output a trip control signal for opening a contact of the circuit breaker when a current value according to the current detection signal of the neutral pole circuit received through the integration circuit section exceeds a preset reference current value.

According to one aspect of the present invention, the printed circuit board comprises:

a burden resistor configured to be connected to an output terminal of the zero-phase current transformer, convert the secondary output current signal into a voltage signal, and provide the voltage signal; and a differential circuit section configured to differentiate the voltage signal and output the differentiated voltage signal.

According to another aspect of the present invention, the enclosure comprises:

a lower enclosing case having a lower portion for receiving the zero-phase current transformer and the printed circuit board therein and an open upper portion; and an upper cover connected to the lower enclosing case to cover an upper portion of the lower enclosing case to close or open the lower enclosing case.

According to still another aspect of the present invention, an upper side portion of the lower enclosing case and a side portion of the upper cover are integrally connected to form a hinge portion providing a rotation supporting point of the upper cover when the upper cover is opened and closed.

According to still another aspect of the present invention, the lower enclosing case has a plurality of sloped protrusions formed on outer surface thereof, whose height increases downwardly, and the upper cover has a plurality of ring portions formed to correspond to the sloped protrusions and caught by the sloped protrusions so as to be connected thereto in a state in which the upper cover is closed.

According to still another aspect of the present invention, in order to allow a transmission line of the neutral pole detection current to pass therethrough, the lower enclosing case has a hollow columnar portion and the upper cover has a through hole portion.

According to still another aspect of the present invention, the neutral pole current detecting apparatus for a circuit breaker according to the present invention further comprising:

phase current detectors configured as Rogowski coils and provided to correspond to AC three phases to detect currents of AC three phases, and configured to provide the currents of AC three phases as voltage signals;

a magnetic trip device configured to be connected to output terminals of the phase current detectors, an output terminal of the neutral pole transformer module, and an output terminal of the overcurrent relay to provide current detection signals of AC three phases from the phase current detectors, to transfer an output signal from the neutral pole transformer module, and to output a mechanical trigger signal to a switching mechanism of the circuit breaker to open a contact of the circuit breaker in response to a trip control signal from the control unit; and a rating plug configured to have a phase-based voltage dividing circuit section configured to divide a voltage of a voltage signal of AC three phases provided from the magnetic trip device and provide the same to the overcurrent relay and a direct input unit configured to transfer a voltage based on the output signal of the neutral pole transformer module provided from the magnetic trip device directly to the overcurrent relay, and connected to the overcurrent relay.

Further scope of applicability of the present application will become more apparent from the present invention given hereinafter. However, it should be understood that the present invention and specific examples, while indicating preferred embodiments of the invention, are given by way of illustration only, since various changes and modifications within the spirit and scope of the invention will become apparent to those skilled in the art from the present invention.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIGS. 5A and 5B are views illustrating an outer configuration of the neutral pole transformer module of a circuit breaker according to an embodiment of the present disclosure, wherein FIG. 5A is a perspective view illustrating a state in which an upper cover is open, viewed from above, and FIG. 5B is a perspective view illustrating a state in which the upper cover is open, viewed from below.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

A protecting device of a neutral pole circuit according to an embodiment of the present disclosure will be described with reference to FIG. 3.

Figure 1:
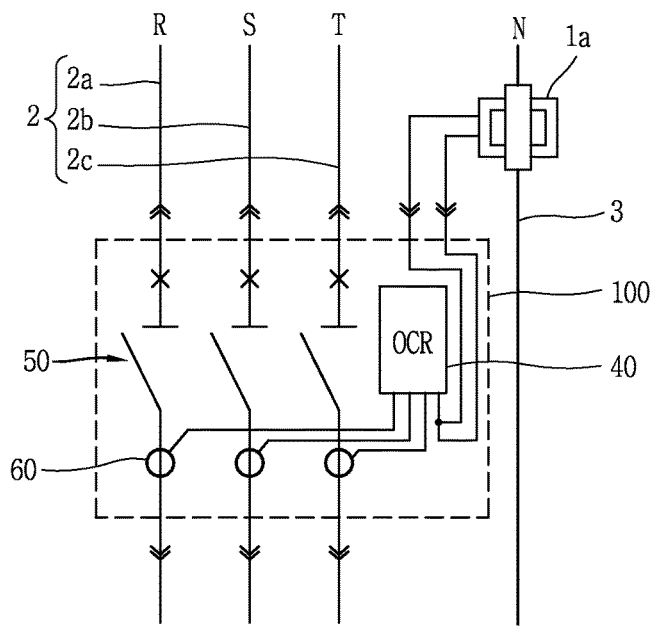
FIG. 1 is a view illustrating a configuration of a protecting device of a neutral pole circuit according to an example of the related art.
Figure 2:
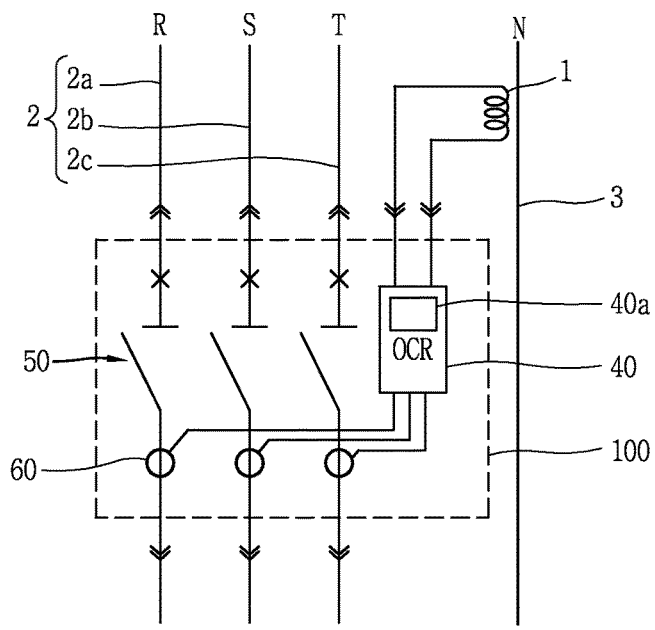
FIG. 2 is a view illustrating a configuration of a protecting device of a neutral pole circuit according to another example of the related art.
Figure 3:
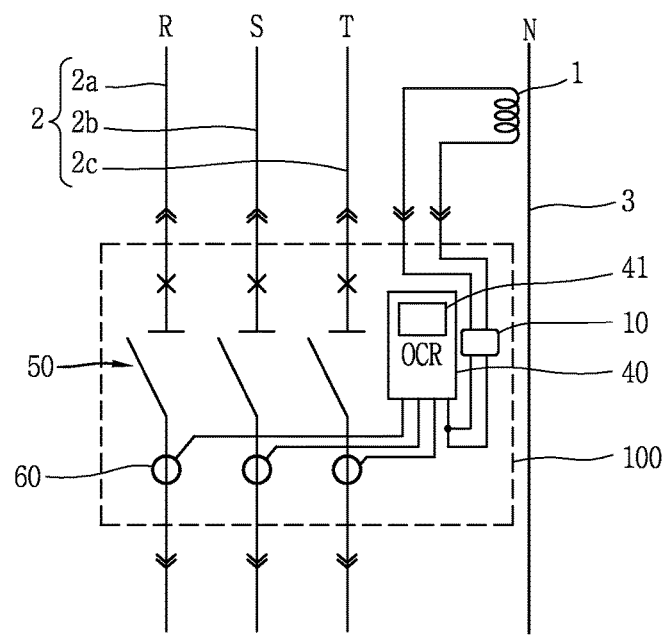
FIG. 3 is a view illustrating a configuration of a protecting device of a neutral pole circuit according to an embodiment of the present disclosure.

In FIG. 3, reference numerals 2a, 2b, and 2c, denote an R phase electric power circuit, an S-phase electric power circuit, and a T-phase electric power circuit of an alternating current three-phases electric power circuit 2 and reference numeral 3 denotes a neutral pole (N-phase) electric power circuit.

In FIG. 3, the protecting device of a neutral pole circuit comprises a current transformer 1 and a circuit breaker 100.

The current transformer 1, a means for detecting a neutral pole current flowing through a neutral pole (N phase) power circuit 3, is configured as a current transformer outputting a current signal of about 5 ampere (A), for example, as an output signal according to an embodiment of the present disclosure. Here, the reason for using the current transformer 1, rather than a Rogowski coil, as a means for detecting a neutral pole current is because the ordinary current transformer 1 is low in price, compared with the Rogowski coil, and above all, the current transformer 1 outputs a current signal without an influence of noise compared with a voltage signal. Meanwhile, the Rogowski coil outputs a voltage signal as a current detection output signal, and thus, it is vulnerable to an influence of noise introduced through a bus bar terminal of the circuit breaker 100.

Also, as for the current transformer 1, a supplier (manufacturer and seller) of the circuit breaker supplies the circuit breaker without the current transformer 1 according to an embodiment of the present disclosure, such that a purchaser (user) of the circuit breaker may purchase the current transformer 1 at low cost on the market.

According to an embodiment of the present disclosure, a purchaser (user) of the circuit breaker may be guided such that, as the current transformer 1, a current transformer having an output current signal of about 5 ampere (A), for example, may be purchased on the market and installed.

If the manufacturer of the circuit breaker directly manufactures or purchases and installs the current transformer 1 to sell the circuit breaker, cost of the current transformer 1 increases due to cost for investment and maintenance of basic manufacturing facilities, resulting in an increase in overall cost of the circuit breaker. Thus, since a customer (purchaser as a user) can easily purchase the current transformer 1 at low cost on the market, the cost of the overall circuit breaker 100 may be reduced, benefiting both the purchaser and user and the circuit breaker manufacturer.

The circuit breaker 100, a low voltage circuit breaker, is configured as an air circuit breaker (can be abbreviated ACB) or a molded case circuit breaker (can be abbreviated MCCB), for example.

The circuit breaker 100 comprises an overcurrent relay 40 is a controller operated to detect a current amount flowing in a circuit and break the circuit when it is determined that a fault current flows in the circuit.

The overcurrent relay 40 comprises an integration circuit section 41 phase-lead shifting a phase of a phase current or a neutral pole current detection signal received from a phase current detector 60 or a current transformer module for neutral pole 10, by 90 degrees.

The circuit breaker 100 further comprises three pairs of switching contacts 50 for three phases, three phase current detectors 60, and a current transformer module for neutral pole 10.

Each pair of switching contacts 50 comprises a fixed contact and a movable contact having a circuit closing position in which the movable contact contacts with the corresponding fixed contact to close an electric power circuit 2 of each phase and a circuit opening position in which the movable contact separates from the corresponding fixed contact to open the electric power circuit 2 of each phase.

The three phase current detectors 60 are configured by Rogowski coils providing a detection signal phase-delayed by 90 degrees compared with an actual current, as a voltage signal generally in unit of millivolt (mV).

The current transformer module for neutral pole 10 receives a current signal from the current transformer 1, and since the corresponding current signal is too large a signal for a microprocessor within the overcurrent relay 40 to handle it, the current transformer module for neutral pole 10 reduces the signal to a ratio of 1/2000, for example. The current transformer module for neutral pole 10 converts the reduced current signal into a voltage signal appropriate for the microprocessor to handle it, and subsequently executes phase delaying processing based on differentiation in consideration of phase leading processing by the integration circuit section 41 of the overcurrent relay 40.

A configuration of the current transformer module for neutral pole 10 for the operation will be described with reference to FIGS. 4 through 7 hereinafter.

A configuration of the current transformer module for neutral pole 10 of the circuit breaker according to an embodiment of the present disclosure will be described with reference to FIG. 5 illustrating an outer configuration of the current transformer module for neutral pole 10 of the circuit breaker according to an embodiment of the present disclosure.

Figure 5A:
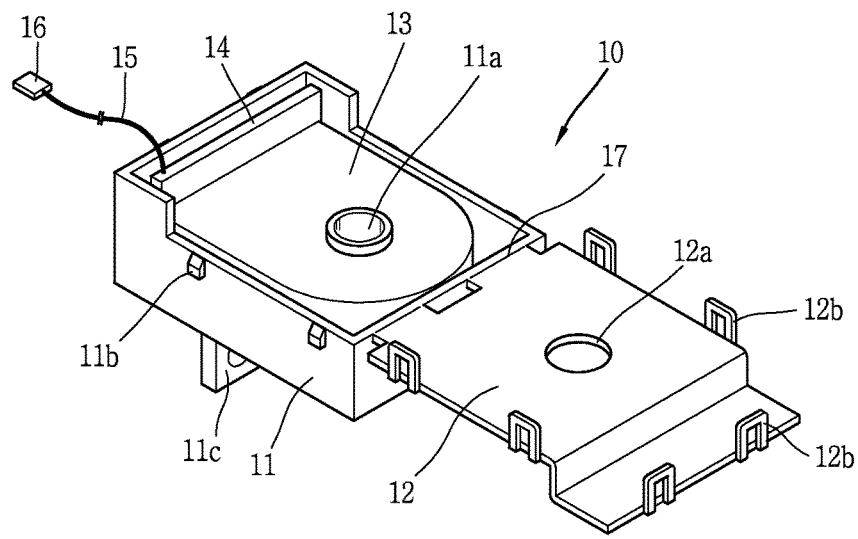
Figure 5B:
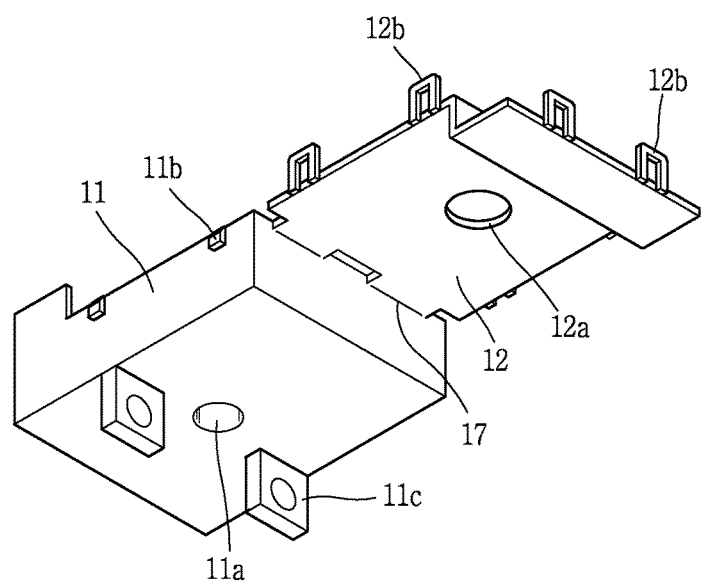

In FIGS. 5A and 5B, the current transformer module for neutral pole 10 of the circuit breaker according to an embodiment of the present disclosure comprises a zero-phase current transformer (abbreviated as ZCT hereinafter) 13, a printed circuit board (abbreviated as PCB hereinafter) 14, and an enclosure.

The ZCT 13 allows a transmission line of a neutral pole detection current output from the current transformer 1 to pass therethrough, and provides a secondary output current signal obtained by reducing the neutral pole detection current in a predetermined ratio.

According to an embodiment of the present disclosure, the predetermined ratio may be 1/2000, and a neutral pole detection current of about 5 ampere output by the current transformer 1 is reduced to a current signal of about 2.5 milliampere, 1/2000, and output.

The ZCT 13 comprises a core allowing the transmission line of the neutral pole detection current to pass therethrough and a coil wound around the core and providing an induction current induced according to currents flowing through the transmission line of the neutral pole detection current.

An output terminal of the ZCT 13 is connected to the PCB 14, and thus, a secondary output current signal obtained by reducing the neutral pole detection current output by the ZCT 13 is transferred to the PCB 14.

The PCB 14 is connected to the output terminal of the ZCT 13, converts the secondary output current signal into a voltage signal, differentiates the converted voltage signal, and outputs the same.

The output signal from the PCB 14 may be transferred to the overcurrent relay 40 through a signal line 15 and a connector 16 connected to an end portion of the signal line 15.

A circuit configuration of the PCB 14 will be described with reference to FIG. 7 hereinafter.

The enclosure is a means formed of an electrical insulator and receiving the ZCT 13 and the PCB 14.

The enclosure comprises a lower enclosing case 11 and an upper cover 12.

The lower enclosing case 11 has a lower portion for receiving the ZCT 13 and the PCB 14 therein and an open upper portion. The lower enclosing case 11 is formed as a box-shaped member having a quadrangular cross-section.

The upper cover 12 is connected to the lower enclosing case 11 to cover an upper portion of the lower enclosing case 11 to close the lower enclosing case or open it.

An upper side portion of the lower enclosing case 11 and a side portion of the upper core 12 are integrally connected to form a hinge portion 17 providing a rotational supporting point of the upper cover 12 when the upper cover 12 is opened and closed.

The lower enclosing case 11 comprises a plurality of sloped protrusions 11b formed on outer surface thereof, and protrusion height of the plurality of protrusions 11b increases downwardly. The upper cover 12 comprises a plurality of ring portions 12b formed to correspond to the sloped protrusions 11b. In a state in which the upper cover 12 is closed, the plurality of ring portions 12b may be caught by the sloped protrusions 11b so as to be connected thereto.

According to an embodiment of the present disclosure, two sloped protrusions 11b are prepared on both side surfaces of the lower enclosing case 11 and two sloped protrusions 11b are prepared on the front surface, and thus, a total of six sloped protrusions 11b may be provided on the lower enclosing case 11. Also, two ring portions 12 are prepared on both side surfaces of the upper cover 12 and two ring portions 12b are prepared on the front surface of the upper cover 12, and thus, a total of six ring portions 12b may be provided on the upper cover 12.

In the lower enclosing case 11, in order to allow the signal line 15 and the connector 16 to be easily led out, a height of one upper portion where the PCB 14 is installed is higher than a height of other upper portion, and thus, a step is formed between the one upper portion where the PCB 14 is installed and the other upper portion. Thus, when the upper cover 12 covers and closes the lower enclosing case 11, a through hole is formed extendedly in a transverse direction between the lower enclosing case 11 and the upper cover 12 and has a height equal to the step, and the signal line 15 and the connector 16 may be led out through the through hole.

In order to allow a transmission line (for example, a signal line) of the neutral pole detection current to pass therethrough, the lower enclosing case 11 has a hollow columnar portion 11a and the upper cover 12 has a through hole portion 12a.

In the enclosure, a plurality of fixing screw through hole portions 11c allowing fixing screws to pass therethrough and fixed to the interior of the circuit breaker 100 are provided on both sides of a lower surface of the lower enclosing case 11 and extend downwardly from the lower surface of the lower enclosing case 11.

Figure 4:
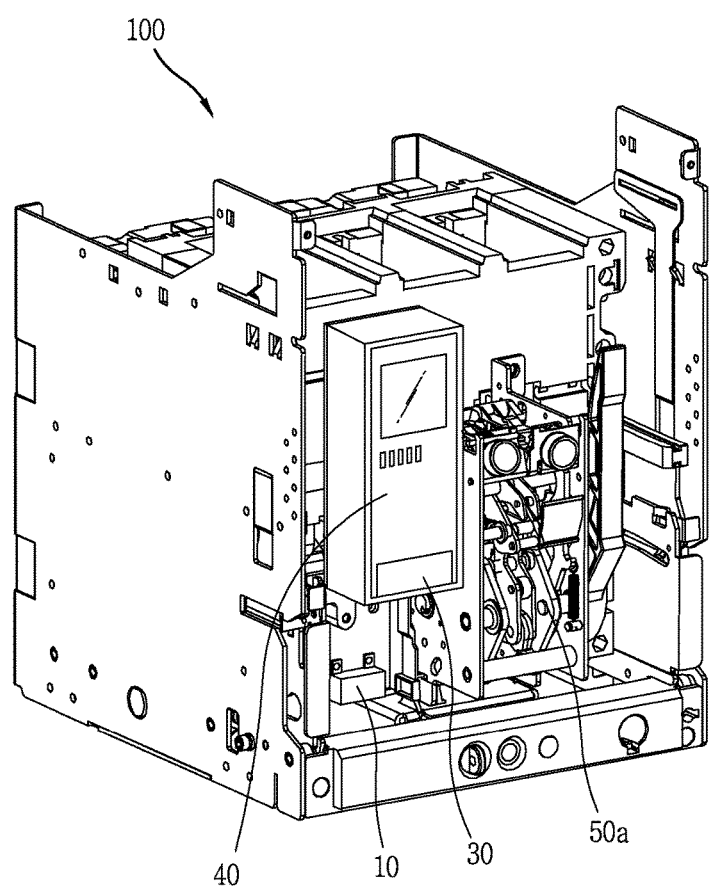
FIG. 4 is an internal perspective view illustrating a state in which a neutral pole transformer module is installed in an air circuit breaker and a front plate of the air circuit breaker has been eliminated, according to an embodiment of the present disclosure.

A state in which the current transformer module for neutral pole 10 is fixed to the interior of the circuit breaker 100 may be referred to FIG. 4.

A circuit configuration of the PCB 14 according to an embodiment of the present disclosure will be described with reference to FIG. 7.

A circuit of the PCB 14 comprise a burden resistor 18 and a differential circuit section 19.

The burden resistor 18 is connected to an output terminal of the ZCT 13, converts the secondary output current signal into a voltage signal, and provides the same.

The differential circuit section 19 is connected to the burden resistor 18, differentiates the voltage signal provided from the burden resistor 18, and outputs the same. Thus, the voltage signal representing a neutral pole current amount is output in a state in which a phase thereof has been delay by 90 degrees, for example.

The differential circuit section 19 may comprise two capacitors C1 and C2 connected in parallel and a resistor R2a, and here, only the capacitor C1 may be provided. Here, when the capacitors C1 and C2 are configured as precise capacitors whose error rate of capacity is 1% or less, the differential circuit section 19 may be configured such that a size error thereof is 1% or less and a phase error is 2% or less.

A configuration of the neutral pole current detecting apparatus of the circuit breaker according to an embodiment of the present disclosure will be described with reference to FIGS. 3 through 8, in particular, mainly with reference to FIG. 6.

Figure 6:
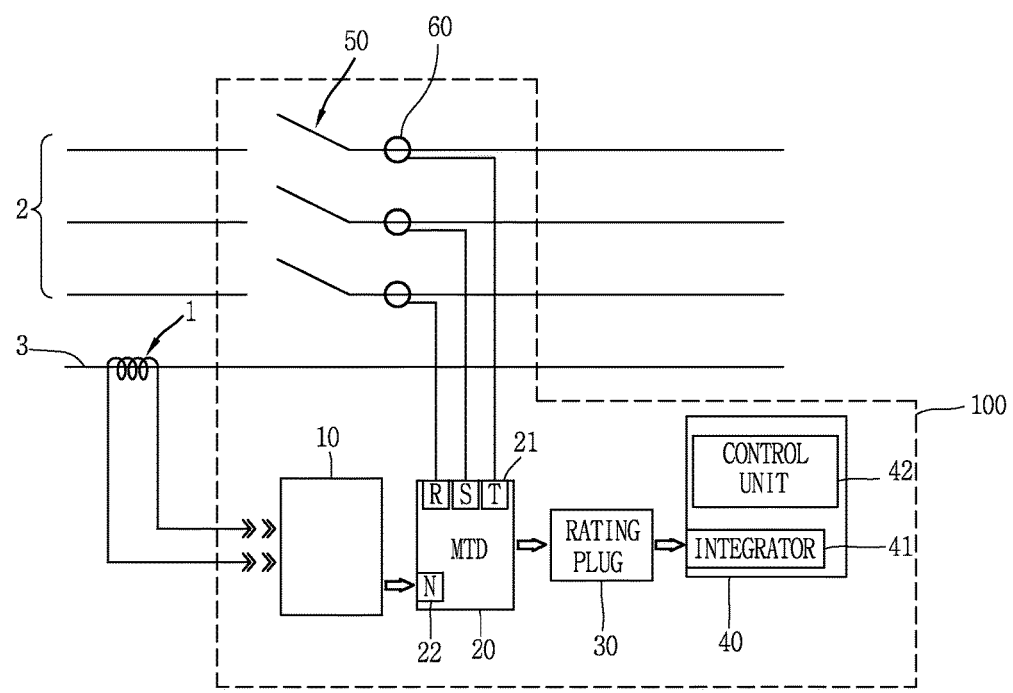
FIG. 6 is a block diagram illustrating a circuit configuration of a neutral pole current detecting apparatus of a circuit breaker according to an embodiment of the present disclosure.

Referring to FIG. 6, the neutral pole current detecting apparatus of the circuit breaker according to an embodiment of the present disclosure may comprise a current transformer 1 and a neutral pole current detecting circuit section within the circuit breaker 100.

Here, the current transformer 1 detects a current of a neutral pole (N phase) electric power circuit 3 of electric power circuits, and provides the same as a current signal.

As described above, the current transformer 1 is configured by a current transformer for outputting a current signal having about 5 ampere (A), for example, as an output signal according to an embodiment of the present disclosure. Here, the reason for using the current transformer 1, rather than a Rogowski coil, as a means for detecting a neutral pole current is because the current transformer 1 output a current signal which is rarely affected by noise, in comparison with a voltage signal.

Also, once the current transformer 1 having an output of about 5 ampere (A) is installed, only the one type of current transformer module for neutral pole 10 according to embodiment of the present disclosure may be able to commonly transform a neutral pole current commonly regardless of type of a circuit breaker and size of a bus bar corresponding to an external terminal unit of the circuit breaker.

Also, according to an embodiment of the present disclosure, a supplier (manufacturer and seller) of the circuit breaker may provide the circuit breaker without the current transformer 1 such that a purchaser (user) may purchase the current transformer 1 at low cost on the market.

The neutral pole current detecting apparatus within the circuit breaker 100 comprises the current transformer module for neutral pole 10 and the overcurrent relay 40.

The current transformer module for neutral pole 10 may comprise the ZCT 13, the burden resistor 18, and the differential circuit section 19.

The ZCT 13 may receive a current detection signal of a neutral pole circuit detected from the current transformer 1, reduces the current signal from the current transformer 1 to a current signal having a 2.5 milliampere (mA) according to a predetermined ratio (e.g., a ratio of 1/2000) and outputs the same.

The burden resistor 18 is connected to an output terminal of the ZCT 13, converts the reduced current signal output from the ZCT 13 into a voltage signal and provides the same.

The differential circuit section 19 comprises capacitors C1 and C2 and a resistor R2a, is connected to the burden resistor 18, differentiates a voltage signal provided from the burden resistor 18, and outputs the same. The differential circuit section 19 phase-delays the voltage signal provided from the burden resistor 18 by 90 degrees, for example, and outputs the same.

The overcurrent relay 40 is a controller of the circuit breaker 100. The overcurrent relay 40 comprises an integration circuit section 41 and a control unit 42.

The integration circuit section may be electrically connected to an output terminal of the current transformer module for neutral pole 10, and integrates an output signal output from the current transformer module for neutral pole 10 to restore the phase which has been delayed by the differential circuit section 19, and provides the same to the control unit 14.

Since the integration circuit section 41 also receives a detection signal of an AC 3-phases current other than the neutral pole current, integrates the signal, and outputs the same, malfunction of the overcurrent relay 40 for an overcurrent or a ground fault current due to phase delay may be prevented.

When a current value according to the current detection signal of the neutral pole circuit received through the integration circuit section 41 exceeds a preset reference current value, the control unit 42 outputs a trip control signal opening the switching contact 50 of the circuit breaker 100. The control unit 42 may be configured as a microprocessor including a memory for providing a previously stored processing program or an intermediate processing value and a central processing unit as a processing means.

According an embodiment of the present disclosure, the neutral pole current detecting apparatus within the circuit breaker 100 may further comprise three phase current detectors 60, a magnetic trip device 20, and a rating plug 30.

The three phase current detectors 60 are configured as Rogowski coils and prepared to correspond to three AC phases to detect currents of three AC phases (poles), and provides current detection signals of the AC three phases electric power circuit 2 as voltage signals.

The magnetic trip device 20 may be connected to an output terminal of the phase current detector 60 and an output terminal of the current transformer module for neutral pole 10, and may be connected to an input terminal of the rating plug 30.

The magnetic trip device 20 may have three phases connection terminal units connected to output terminals of the phase current detectors 60 and a neutral pole connection terminal unit 22 connected to the output terminal of the current transformer module for neutral pole 10.

In FIG. 6, the magnetic trip device 20 provides current detection signals of AC three-phases (AC three poles) from the phase current detector 60 to the overcurrent relay 40 through the rating plug 30, and transfers an output signal from the current transformer module for neutral pole 10 to the overcurrent relay 40 through the rating plug 30.

Also, in response to a trip control signal from the control unit 42 of the overcurrent relay 40, the magnetic trip device 20 outputs a mechanical trigger signal to a contact switching mechanism (50a of FIG. 4) of the circuit breaker 100 to open the switching contact 50 of the circuit breaker 100.

Detailed configuration and operation of the magnetic trip device 20 may be referred to Korean Patent Registration Nos. KR10-0854387 B1 and KR10-1212213 B1 registered by the applicant of the present application.

As illustrated in FIG. 4, the rating plug 30 may be installed in a lower position of the overcurrent relay 40 and electrically connected thereto. Details of the connection configuration of the rating plug 30 and the overcurrent relay 40 may be referred to Korean Utility Model Publication No. KR20-2012-0001883U filed by the applicant of the present application.

Figure 8:
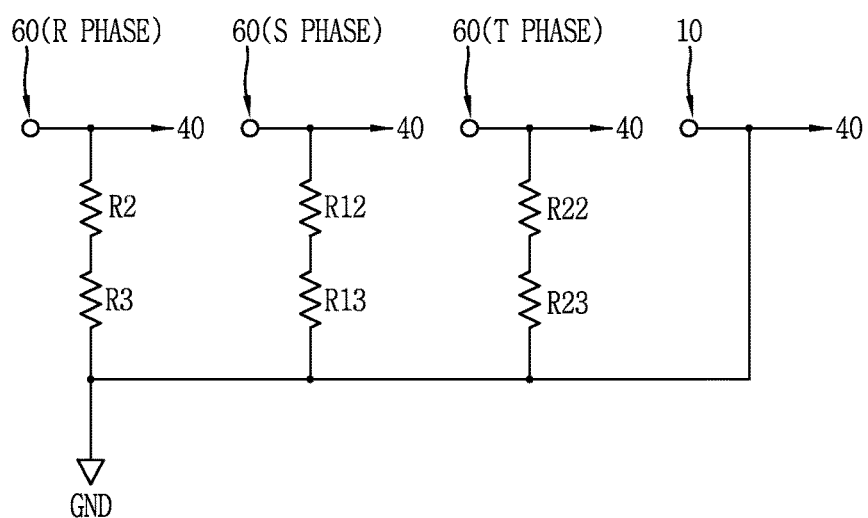
FIG. 8 is a circuit diagram illustrating a configuration of a phase current transfer circuit of a rating plug in the neutral pole current detecting apparatus of a circuit breaker according to an embodiment of the present disclosure.

A circuit configuration of the rating plug 30 for providing AC three-phases current detection signals to the overcurrent relay 40 and providing an output signal from the current transformer module for neutral pole 10 to the overcurrent relay 40 may be referred to FIG. 8.

As illustrated in FIG. 8, the rating plug 30 has voltage-dividing resistors R2 and R3 for R phase that voltage-divides a voltage signal input from the R phase current detector among the phase current detectors 60 and providing the same to the overcurrent relay 40, voltage-dividing resistors R12 and R13 for S phase that voltage-divides a voltage signal input from the S phase current detector among the phase current detectors 60 and providing the same to the overcurrent relay 40, voltage-dividing resistors R22 and R23 for T phase that voltage-divides a voltage signal input from the T phase current detector among the phase current detectors 60 and providing the same to the overcurrent relay 40, and a direct input unit (please refer to a circuit line portion without a resistor on the right side of an input terminal from reference numeral 10 in FIG. 8) transferring a voltage according to an output signal from the neutral pole transformer module to the overcurrent relay 40 as is.

Operations of the neutral pole transformer module of the circuit breaker and the neutral pole current detecting apparatus according to an embodiment of the present disclosure will be described with reference to FIGS. 3 through 8.

The current transformer 1 detects a neutral pole current of an electric power circuit and transfers a current signal having a 5 ampere (A) level, for example, to the current transformer module for neutral pole 10. According to an aspect of the present disclosure, the detection signal of the neutral pole current is a current signal, and thus, while the detection signal of the neutral pole current is being transferred from bus bars corresponding to terminal units of a power source and a load of the circuit breaker 100 to the current transformer module for neutral pole 10 within the circuit breaker 100, the detection signal of the neutral pole current is rarely affected by external noise (i.e., it is not distorted).

Figure 7:
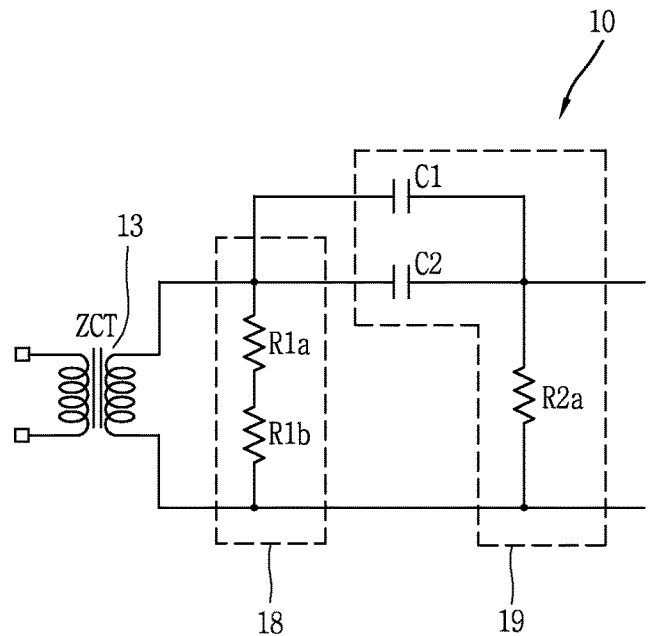
FIG. 7 is a circuit diagram illustrating a circuit configuration of a neutral pole transformer module of a circuit breaker according to an embodiment of the present disclosure.

Then, the ZCT 13 of the current transformer module for neutral pole 10 in FIG. 7 reduces the 5-ampere (A)-level current signal from the current transformer 1 into 1/2000, i.e., about 2.5 milliampere (mA)-level current signal and transfers a secondary output current signal to the burden resistor 18.

The burden resistor 18 of the current transformer module for neutral pole 10 converts the secondary output current signal output from the ZCT 13 into a voltage signal, and transfers the converted voltage signal to the differential circuit section 19.

Then, the differential circuit section 19 of the current transformer module for neutral pole 10 differentiates the voltage signal provided from the burden resistor 18 and outputs the same, and here, the differential circuit section 19 phase-delays the voltage signal provided from the burden resistor 18 by 90 degrees, for example, and outputs the same.

The voltage signal output from the current transformer module for neutral pole 10 after being 90-degree phase-delayed is transferred to the overcurrent relay 40 through the magnetic trip device 20 and the rating plug 30.

The voltage signal transferred to the overcurrent relay 40 is integrated by the integration circuit section 41 and restored from the 90-degree phase-delayed state to the original state.

Thereafter, when the neutral pole current value according to the current detection signal of the neutral pole circuit, namely, the restored voltage signal, received through the integration circuit unit 41 exceeds a preset reference current value, the control unit 42 of the overcurrent relay 40 outputs a trip control signal for opening the switching contact 50.

The corresponding trip control signal is transferred to the magnetic trip device 20, and in response to the trip control signal from the control unit 42, the magnetic trip device 20 outputs a mechanical trigger signal to the contact switching mechanism (please refer to the portion denoted by reference numerals 50a of FIG. 4) of the circuit breaker 100 to open the switching contact 50 of the circuit breaker 100. Since the switching contact 50 is opened according to the driving of the contact switching mechanism 50a, the circuit is broken (tripped), and thus, the circuit breaker 100 protects the connected electric power circuits, the load device, and the like, from an electrical accident when a current greater than the neutral pole fault current occurs.

As described above, since the neutral pole transformer module of the circuit breaker and the neutral pole current detecting apparatus according to an embodiment of the present disclosure use the transformer outputting a current signal, as a neutral pole current detecting means, a current detection signal transferred from the bus bar outside of the circuit breaker to the interior of the circuit breaker is a current signal, rather than a voltage signal, obtaining an effect of minimizing influence of external noise.

Since the neutral pole transformer module of the circuit breaker and the neutral pole current detecting apparatus according to an embodiment of the present disclosure use the current transformer which is low in price, relative to the Rogowski coil, which can be easily purchased by a user on the market and install it, and which outputs a predetermined level of output current amount (e.g., 5 ampere), since the ZCT converting a large current signal from the current transformer into a small signal (for example, conversion in the ratio of 1/2000) and the differential circuit section in preparation for phase shifting by the integration circuit section of the overcurrent are configured in the neutral pole transformer module, rather than in the overcurrent relay, further since the single type of neutral pole transformer module is commonly configured for various circuit breakers according to various rated electricity amounts, a very economical neutral pole transformer module of the circuit breaker and a very economical neutral pole current detecting apparatus may be configured.

In the neutral pole transformer module of the circuit breaker and the neutral pole current detecting apparatus according to an embodiment of the present disclosure, since the ZCT converting a large current signal from the current transformer into a small signal and the differential circuit section in preparation for phase shifting by the integration circuit section of the overcurrent relay are configured in the neutral pole transformer module, rather than in the overcurrent relay, it is possible to detect a neutral pole current without having to modifying the configuration of an existing overcurrent relay or without having to install an additional component in the existing overcurrent relay.

In the neutral pole transformer module of the circuit breaker and the neutral pole current detecting apparatus according to an embodiment of the present disclosure, since the neutral pole transformer module may be configured as a single type of module commonly for various circuit breakers and various rating plugs having various capacity, an additional configuration and maintenance may be simplified.

Also, in the neutral pole transformer module of the circuit breaker and the neutral pole current detecting apparatus according to an embodiment of the present disclosure, the neutral pole transformer module may be configured to have a small size of about 31 millimeters in width, 35 millimeters in length, and 22 millimeters in height, an additional installation and maintenance thereof in the circuit breaker may be simplified.

Also, in the neutral pole transformer module of the circuit breaker and the neutral pole current detecting apparatus according to an embodiment of the present disclosure, since the neutral pole transformer module comprises the ZCT, the PCB, and the enclosure enclosing (or accommodating) the ZCT and the PCB, an intermediate conversion means for reducing a current size of a neutral pole current detection signal detected by the transformer, converting the current into a voltage signal, differentiating the converted voltage signal and outputting the same to the overcurrent relay may be provided in the form of a module which is easy to install in the circuit breaker and allows for simple maintenance.

Also, in the neutral pole transformer module of a circuit breaker according to an embodiment of the present disclosure, since the enclosure comprises the lower enclosing case and the upper cover, the ZCT and the PCB may be accommodated within the lower enclosing case and covered with the upper cover, thereby forming a module easy to handle and simple to assemble.

Also, in the neutral pole transformer module of a circuit breaker according to an embodiment of the present disclosure, since one side portion of the lower enclosing case and one side portion of the upper cover are integrally connected to form a hinge portion, an additional hinge member is not required and a rotation supporting point of the upper cover may be provided when the upper cover is opened and closed.

Also, in the neutral pole transformer module of a circuit breaker according to an embodiment of the present disclosure, since the lower enclosing case has the plurality of sloped protrusions formed on outer surfaces thereof, whose height increases downwardly, and the upper cover has the plurality of ring portions formed to correspond to the sloped protrusions, and caught by the sloped protrusions so as to be connected thereto in a state in which the upper cover is closed, the state in which the upper cover closes the lower enclosing case by the connection between the plurality of sloped protrusions and the plurality of ring portions may be firmly maintained.

Also, in the neutral pole transformer module of a circuit breaker according to an embodiment of the present disclosure, since the lower enclosing case has the hollow columnar portion and the upper cover has the through hole portion, a transmission line of a neutral pole current detection signal may be allowed to pass through the hollow columnar portion and the through hole portion, the ZCT installed around the columnar portion may be able to convert the neutral pole current detection signal into a small current signal.

Also, in the neutral pole transformer module of a circuit breaker according to an embodiment of the present disclosure, since the enclosure has the plurality of fixing screw through hole portions, fixing screws may be fastened through the corresponding fixing screw through hole portions to fix the neutral pole transformer module to the interior of the circuit breaker.

The neutral pole current detecting apparatus for a circuit breaker according to an embodiment of the present disclosure further comprises: phase current detectors configured as Rogowski coils provided to correspond to AC three phases to detect currents of AC three phases (poles), and configured to provide the currents of AC three phases (poles) as voltage signals; a magnetic trip device configured to be connected to output terminals of the phase current detectors and an output terminal of the neutral pole transformer module to provide current detection signals of AC three phases (poles) from the phase current detectors, to transfer an output signal from the neutral pole transformer module, and to output a mechanical trigger signal to a contact switching mechanism of the circuit breaker to open a contact of the circuit breaker in response to a trip control signal from the control unit; and a rating plug configured to have voltage dividing circuit sections configured to divide voltages of a voltage signals of AC three phases (poles) provided from the magnetic trip device and providing the same to the overcurrent relay and a direct input unit configured to transfer a voltage according to an output signal of the neutral pole transformer module provided from the magnetic trip device as is to the overcurrent relay, and connected to the overcurrent relay. Thus, three phases (poles) current other than a neutral pole may be detected, a mechanical trigger signal in response to a trip control signal of a control unit as a magnetic trip device may be output to a contact switching mechanism to perform a trip operation to open the contact, and a voltage according to an output signal of the neutral pole transformer module may be transferred as is to the overcurrent relay.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A neutral pole transformer module for a circuit breaker to which a current transformer for detecting a neutral pole current is connected, the neutral pole transformer module comprising:
   a zero-phase current transformer connected to the current transformer, the zero-phase current transformer configured to pass a neutral pole detection current output from the current transformer and to provide a secondary output current signal that is obtained by reducing the neutral pole detection current from the current transformer according to a predetermined ratio;
   a printed circuit board (PCB) connected to an output terminal of the zero-phase current transformer, the PCB configured to convert the secondary output current signal to a voltage signal, to differentiate the converted voltage signal and to output a differentiated voltage; and
   an enclosure formed of an electrical insulator and enclosing the zero-phase current transformer and the PCB.

2. The neutral pole transformer module of claim 1, wherein the PCB comprises:
   a burden resistor connected to an output terminal of the zero-phase current transformer and configured to convert the secondary output current signal to the voltage signal; and
   a differential circuit configured to differentiate the converted voltage signal from the burden resistor and to output the differentiated voltage.

3. The neutral pole transformer module of claim 1, wherein the enclosure comprises:
   a lower case having a lower portion for accommodating the zero-phase current transformer and the PCB and an open upper portion; and
   an upper cover connected to the lower case to cover an upper portion of the lower case such that the upper portion of the lower case may be opened or closed.

4. The neutral pole transformer module of claim 3, wherein an upper side portion of the lower case and a side portion of the upper cover are connected to form a hinge portion providing a rotation point for opening and closing the upper cover.

5. The neutral pole transformer module of claim 3, wherein:
   an outer surface of the lower case has a plurality of sloped protrusions with a height that increases downwardly; and
   the upper cover has a plurality of ring portions that correspond to the sloped protrusions such that the plurality of ring portions are connected to the sloped protrusions when the upper cover is closed.

6. The neutral pole transformer module of claim 3, wherein:
   the lower case has a hollow columnar portion; and
   the upper cover has a through hole portion to pass the neutral pole detection current.

7. A neutral pole current detecting apparatus for a circuit breaker, the apparatus comprising:
   a current transformer configured to detect a current of a neutral pole circuit and output a neutral pole detection current;
   a neutral pole transformer module comprising:
     a zero-phase current transformer connected to the current transformer, the zero-phase current transformer configured to receive the neutral pole detection current from the current transformer, to reduce the neutral pole detection current according to a predetermined ratio and to output the reduced neutral pole detection current;
     a burden resistor configured to convert the reduced neutral pole detection current from the zero-phase current transformer to a converted voltage; and
     a differential circuit configured to differentiate the converted voltage from the burden resistor and to output the differentiated voltage; and
   an overcurrent relay comprising:
     an integration circuit electrically connected to an output terminal of the neutral pole transformer module and configured to integrate the differentiated voltage from the neutral pole transformer module in order to restore a phase delayed by the differential circuit; and a control unit configured to output a control signal for opening a contact of the circuit breaker when the neutral pole detection current exceeds a preset value.

8. The apparatus of claim 7, further comprising:

phase current detectors configured as Rogowski coils to detect three-phase AC currents and output the detected currents as voltages;

a magnetic trip device connected to the phase current detectors, to the neutral pole transformer module, and to the overcurrent relay, the magnetic trip device configured to:

output the detected currents from the phase current detectors;

output a signal from the neutral pole transformer module; and output a mechanical trigger signal to a switching mechanism of the circuit breaker to open the contact of the circuit breaker in response to the control signal from the control unit; and a rating plug comprising:

a phase-based voltage dividing circuit configured to divide a three-phase AC voltage output by the magnetic trip device and to output the divided three-phase AC voltage to the overcurrent relay; and an input unit connected to the overcurrent relay and configured to output a voltage that is based on the signal output by the magnetic trip device.

\* \* \* \* \*